(12) United States Patent
Kaplan

(10) Patent No.: US 7,002,499 B2
(45) Date of Patent: Feb. 21, 2006

(54) CLOCKED D/A CONVERTER

(75) Inventor: Todd Kaplan, Los Angeles, CA (US)

(73) Assignee: HRL Laboratories, LLC, Malibu, CA (US)

( * ) Notice: Subject to any disclaimer, the term of this patent is extended or adjusted under 35 U.S.C. 154(b) by 42 days.

(21) Appl. No.: 10/763,071

(22) Filed: Jan. 21, 2004

(65) Prior Publication Data

US 2005/0156765 A1   Jul. 21, 2005

(51) Int. Cl.
  *H03M 1/66* (2006.01)
  *H03M 1/06* (2006.01)
(52) U.S. Cl. ........................... 341/144; 341/119
(58) Field of Classification Search ............... 341/144, 341/118, 120, 108, 136, 153, 165, 135, 68, 341/69, 119
See application file for complete search history.

(56) References Cited

U.S. PATENT DOCUMENTS

| | | | | |
|---|---|---|---|---|
| 2,914,758 | A * | 11/1959 | Retzinger, Jr. | 341/153 |
| 4,083,043 | A | 4/1978 | Breuer | 341/165 |
| 4,112,426 | A * | 9/1978 | Hofer et al. | 341/108 |
| 5,343,196 | A * | 8/1994 | Harston | 341/136 |
| 5,450,084 | A * | 9/1995 | Mercer | 341/153 |
| 5,625,360 | A * | 4/1997 | Garrity et al. | 341/144 |
| 5,933,107 | A * | 8/1999 | Tan | 341/144 |
| 6,061,010 | A | 5/2000 | Adams et al. | 341/144 |
| 6,124,817 | A * | 9/2000 | Ho | 341/144 |
| 6,191,719 | B1 * | 2/2001 | Bult et al. | 341/144 |
| 6,346,899 | B1 * | 2/2002 | Hadidi | 341/144 |
| 6,417,793 | B1 * | 7/2002 | Bugeja et al. | 341/144 |
| 6,476,748 | B1 | 11/2002 | Galton | 341/144 |
| 6,507,295 | B1 * | 1/2003 | Volk | 341/118 |
| 6,597,303 | B1 | 7/2003 | Cosand | 341/165 |
| 6,621,438 | B1 | 9/2003 | Hong | 341/144 |
| 6,628,220 | B1 | 9/2003 | Cosand | 341/144 |
| 6,639,534 | B1 * | 10/2003 | Khoini-Poorfard et al. | 341/144 |
| 6,788,229 | B1 * | 9/2004 | Wittlinger | 341/120 |
| 6,833,801 | B1 * | 12/2004 | Ostrem et al. | 341/144 |
| 6,879,276 | B1 * | 4/2005 | Devendorf et al. | 341/144 |
| 6,919,834 | B1 * | 7/2005 | Inukai | 341/144 |

OTHER PUBLICATIONS

U.S. Appl. No. 10/761,790, filed Jan. 21, 2004, Cosand.

Adams, R., et al., "A 113-dB SNR Oversampling DAC With Segmented Noise-Shaped Scrambling," *IEEE Journal of Solid-State Circuits*, vol. 33, No. 12, pp. 1871-1878 (1998), no month.

Adams, R., et al., "A 113dB SNR Oversampling DAC with Segmented Noise-Shaped Scrambling," *IEEE International Symposium on Circuits and Systems*, pp. 62-64 (1998), no month.

(Continued)

*Primary Examiner*—Patrick Wamsley
(74) *Attorney, Agent, or Firm*—Ladas & Parry LLP

(57) ABSTRACT

A digital-to-analog converter is disclosed, comprising an input/output circuit, a bistable circuit connected with the input/output circuit, a clock circuit connected with the input/output circuit and the bistable circuit, and a current generator circuit connected with the clock circuit. The clock circuit acts as a switch, providing current from the current generator either to the input/output circuit or to the bistable circuit. The digital input signal switches when the current generator provides current to the bistable circuit, and switching of the input signal is asserted at the output of the converter when the current generator provides current to the input/output circuit. Therefore, switching of a clock circuit signal, rather than switching of the digital input signal determines switching of the output signal, in order to reduce intersymbol interference of the converter associated with thermal hysteresis of some of the components of the converter.

15 Claims, 4 Drawing Sheets

OTHER PUBLICATIONS

Chan, K. T., et al., "Components For A GAAS Delta-Sigma Modulator Oversampled Analog-To-Digital Converter," *IEEE International Symposium on Circuits and Systems,* pp. 1300-1303 (1992), no month.

* cited by examiner

CLOCKED D/A CONVERTER

CROSS-REFERENCE TO RELATED APPLICATIONS

Reference is made to the copending U.S. patent application Ser. No. 10/761,790 entitled "Clocked DAC Current Switch" by Albert E. Cosand, assigned to Raytheon Company, filed on the same date of the present application, the disclosure of which is incorporated herein by reference in its entirety.

BACKGROUND

1. Field

The present invention relates to a digital-to-analog converter (DAC). More specifically, the present invention relates to a clocked DAC, where a clock prevents the DAC from emitting an output until the DAC inputs have fully switched.

2. Related Prior Art

DACs typically come in two forms, return to zero (RTZ) DACs, where signals return to zero also in absence of a data transition, and non return to zero (NRTZ) DACs, where signals do not return to zero, except during a data transition. DACs typically comprise many transistors, which can be subject to intersymbol interference coming, for example, from thermal hysteresis.

The thermal hysteresis problem will be discussed in more detail with reference to FIG. 1, which shows a prior art DAC comprising a differential pair 10 connected with a current generator 40 and digital inputs IN, INX applied to the differential pair 10. The differential pair 10 comprises transistors Q1 and Q2. The digital inputs IN and INX are applied to the base of Q1 and Q2. The emitters of Q1 and Q2 are connected with the current generator 40. The output of the DAC is an analog current output I1, I2 taken on the collectors 11, 12 of the transistors Q1 and Q2.

The ON condition or OFF condition of a transistor, such as Q1 or Q2, is regulated by its base-emitter voltage $V_{BE}$(On). The threshold voltage $V_{BE}$(On) is a function of temperature of the base-emitter junction. The higher the temperature of the junction, the lower the value of $V_{BE}$(On) required to turn the transistor ON. The lower the temperature of the junction, the higher the value of $V_{BE}$(On) required to turn the transistor ON.

Reference will now be made also to FIG. 2, which shows logic values of the input signals IN, INX as a function of time and temperature values T(Q1), T(Q2) of the base-emitter junction of transistors Q1, Q2 as a function of time. The digital input INX is the complementary of digital input IN. Digital inputs IN and INX switch aperiodically. Assuming that the starting condition of the IN digital input is a 'high' value and the starting condition of the INX digital input is a 'low' value, when the IN digital input switches and begins to change from high to low, the temperature T(Q1) of transistor Q1 will begin to change from high to low, as shown in FIG. 2. Similarly, in a complementary manner, the temperature T(Q2) of transistor Q2 will begin to change from low to high, as shown by the dotted line of FIG. 2.

Q1 and Q2 switch for the second time at t2, i.e. when IN, INX switch again. At time t2, T(Q1) has not fully settled to a low temperature value typical of an OFF condition. The value $\Delta(T1)=|T(Q1)_{t1}-T(Q2)_{t1}|$ represents the difference between the value of T(Q1) and the value of T(Q2) at time t1. The value $\Delta(T2)=|T(Q1)_{t2}-T(Q2)_{t2}|$ represents the difference between the value of T(Q1) and the value of T(Q2) at time t2. It can be noted that $|T(Q1)_{t2}-T(Q2)_{t2}|<|T(Q1)_{t1}-T(Q2)_{t1}|$. The greater the temperature difference between Q1 and Q2, the longer it will take to switch the output current after the input signal switches. Therefore, when Q1 is switched ON again at the time t2, Q1 will reach an ON condition faster than the previous instance. Similarly, at time t3, when IN, INX switch again, T(Q2) has not fully settled to a low temperature value typical of the OFF condition. The value $\Delta(T3)=|T(Q1)_{t3}-T(Q2)_{t3}|$ represents the difference between the value of T(Q1) and the value of T(Q2) at time t3. Therefore, when Q2 is switched ON again at the time t3, Q2 will reach an ON condition faster than at time t2 It follows that there is a variable anticipation or delay in reaching an ON or OFF condition, depending on the value of the temperature differences $\Delta T1$, $\Delta T2$ and $\Delta T3$. This behavior is called thermal hysteresis and could bring to intersymbol interference. Thermal hysteresis is, therefore, unacceptable, because it could be the cause of possible distortion.

A possible solution to the problem of thermal hysteresis in DACs is disclosed in Adams R. and Nguyen, K. Q, "A 113-dB SNR Oversampling DAC with Segmented Noise-Shaped Scrambling," IEEE Journal of Solid State Circuits, Vol. 33, Issue 12, December 1998, pp. 1871–1878. Adams discusses a NRTZ DAC configuration which relies upon two RTZ DACs with opposite clock phases. However, this configuration relies upon two separate current sources having two different phases, thus requiring double the power dissipation. This kind of dissipation is typical in RTZ DACs where, for a given clock cycle, the DAC is ON half of the time and OFF the other half of the time. An additional problem is due to the different behavior of the two current sources, which causes a slightly different amount of current to go to the output from one clock phase to the next.

Therefore, there is a need for an improved DAC that alleviates the effects of thermal hysteresis and at the same time limits the amount of dissipated power.

SUMMARY

The present invention overcomes the prior art problems, enabling the thermal hysteresis drawback of transistors Q1 and Q2 to be overcome.

According to a first aspect, a digital-to-analog converter is disclosed, comprising: a differential transistor pair comprising a first input/output transistor and a second input/output transistor, the first input/output transistor and the second input/output transistor having an input terminal, an output terminal and a third terminal, the differential transistor pair receiving a differential logic signal at the input terminals of the first input/output transistor and the second input/output transistor; a bistable circuit connected with the output terminal of the first input/output transistor and the output terminal of the second input/output transistor; a clock circuit comprising a first clock transistor and a second clock transistor connected as a differential pair, the first clock transistor and the second clock transistor having a clock input terminal, a clock second terminal, and a clock third terminal, the clock second terminal of the first clock transistor being connected with the third terminal of the first and second input/output transistor, and the clock second terminal of the second clock transistor being connected with the bistable circuit; and a current source connected with the clock third terminal of the first clock transistor and the clock third terminal of the second clock transistor, wherein: the clock circuit acts as a switch, controlling the converter so as to provide current from the current source either to the differential transistor pair or to the bistable circuit; and the input terminals of the first and second input/output transistor receive signals switching between a first logic value and a second logic value, switching between the first logic value and the second logic value occurring when the clock circuit controls the converter so as to provide current from the current source to the bistable circuit, said switching being asserted at the output terminal of the first and second input/output transistor when the clock circuit controls the converter so as to provide current from the current source to the differential transistor pair.

According to a second aspect, a digital-to-analog conversion method is disclosed, comprising: connecting a first transistor and a second transistor as a differential pair, the first transistor and the second transistor having a switch input terminal, a switch output terminal and a switch third terminal, the first transistor and second transistor receiving a differential logic signal at the switch input terminals; connecting a bistable circuit with the switch output terminal of the first transistor and the output terminal of the second transistor; connecting a third transistor and a fourth transistor as a differential pair, the third transistor and the fourth transistor having a clock input terminal, a clock second terminal, and a clock third terminal; connecting the clock second terminal of the third transistor with the switch third terminal of the first and second transistor; connecting the clock second terminal of the fourth transistor with the bistable circuit; connecting the clock third terminal of the third transistor and fourth transistor with a current source; providing the switch input terminal of the first transistor with a first input signal and the switch input terminal of the second transistor with a second input signal complementary to the first input signal, the first and second input signals being switchable between a first logic input value and a second logic input value; providing the clock input terminal of the third transistor with a first clock signal and the clock input terminal of the fourth transistor with a second clock signal complementary to the first clock signal; and switching the first clock signal between a first clock value and a second clock value, the first clock value allowing the third transistor to conduct current from the current source to the first and second transistor and allowing the fourth transistor to block current from the current source to the bistable circuit, the second clock value allowing the third transistor to block current from the current source to the first and second transistor and allowing the fourth transistor to conduct current from the current source to the bistable circuit.

According to a third aspect, a digital-to-analog converter is disclosed, comprising: an input/output circuit receiving a digital input signal and outputting an analog output signal; a bistable circuit connected with the input/output circuit; a clock circuit connected with the input/output circuit and the bistable circuit; and a current generator circuit connected with the clock circuit, wherein: the clock circuit acts as a switch, providing current from the current generator either to the input/output circuit or to the bistable circuit; the digital input signal is a switchable signal switching when the current generator provides current to the bistable circuit; and the analog output signal is a switchable signal associated with the digital input signal, the analog output signal switching when the current generator provides current to the input/output circuit.

According to a fourth aspect, a non-return-to-zero (NRZ) digital-to-analog converter comprising a single current source is disclosed, the converter having a first input, a second input and an output, wherein the first input determines how current is routed between the current source and the output, and the second input determines when routing of the current between the current source and the output is allowed to change.

BRIEF DESCRIPTION OF THE DRAWINGS

The present invention will be understood and appreciated more fully from the following detailed description taken in conjunction with the drawings in which.

DETAILED DESCRIPTION

Figure 3:
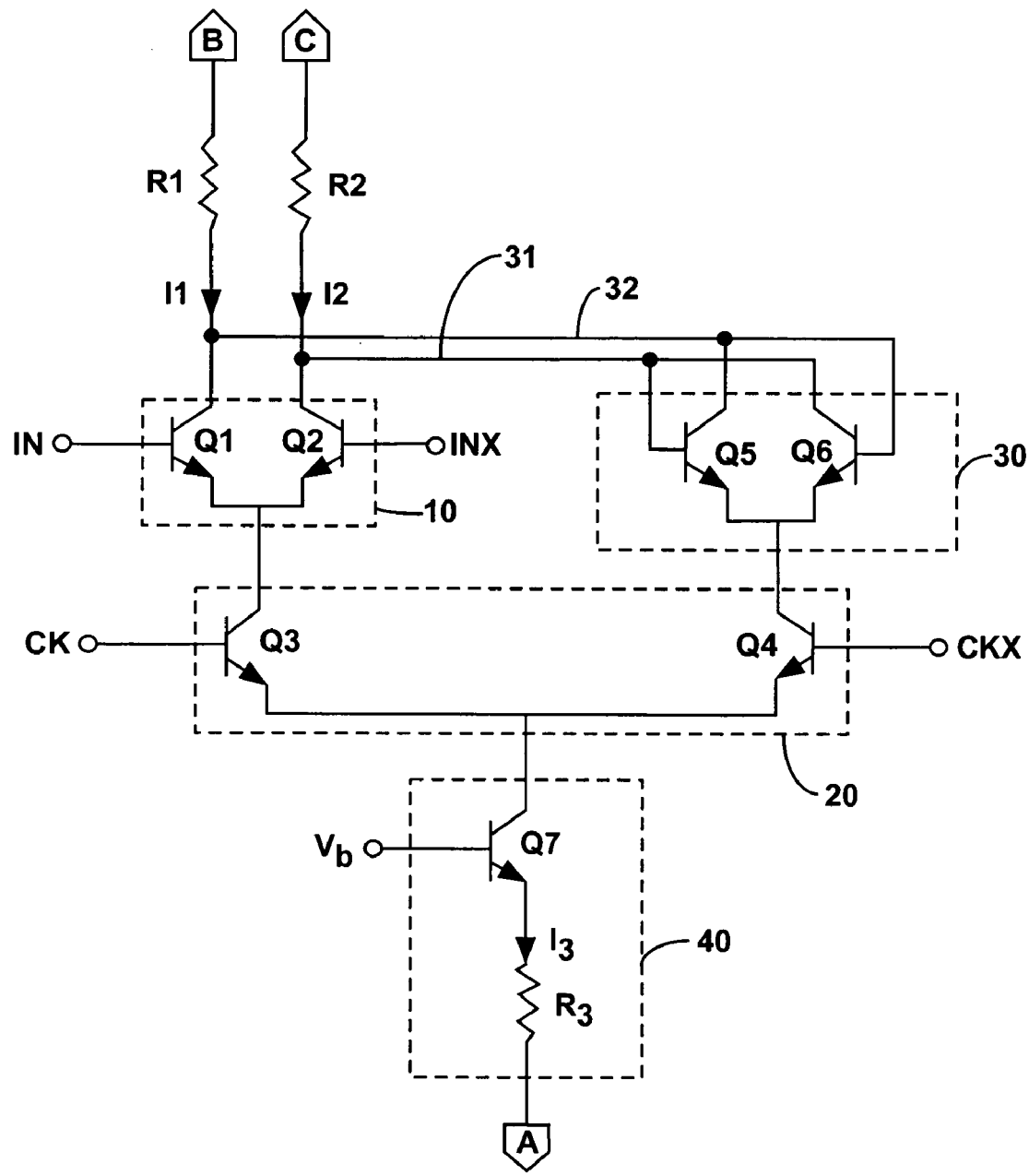
FIG. 3 is a circuit diagram showing the preferred embodiment of the DAC according to the present disclosure.

FIG. 3 shows a clocked NRTZ DAC according to a preferred embodiment of the present invention. A differential transistor pair 10 is connected with a clock circuit 20 and a bistable circuit 30. The bistable circuit 30 enables latching and operates as a positive feedback amplifier. The clock circuit 20 is also connected with a current generator 40 and the bistable circuit 30. The differential transistor pair 10 and the current generator 40 can be identical to those of the prior art shown in FIG. 1 of the present application. For example, FIG. 3 shows that the transistor pair 10 comprises npn bipolar transistors Q1 and Q2. The bases of Q1 and Q2 receive digital voltage input signals IN and INX, respectively. The emitters of Q1 and Q2 are connected together, and the analog current output of the DAC (currents I1, I2) is taken on the collectors of Q1 and Q2. The current source 40 comprises npn bipolar transistor Q7 and resistor R3, connected with the emitter of transistor Q7. The value of the current I3 depends on the values of the biasing voltage Vb, resistor R3, and voltage at node A. Nodes A, B, and C of FIG. 3 are typically used to power the DAC and to connect the DAC to a larger circuit. A first resistor R1 is coupled to the collector of Q1 and a second resistor R2 is coupled to the collector of Q2. The value of R1 and R2 is typically in the order of 50 Ω–300 Ω. The sum of currents I1 and I2 is substantially equal to the value of the current I3 generated by the current generator 40. A specific value for I3 can be obtained by varying the voltage Vb at the base of the transistor Q7, the voltage at node A, or the value of R3. Typically, R3 has a value in the range of 60 Ω–1 KΩ.

Figure 1:
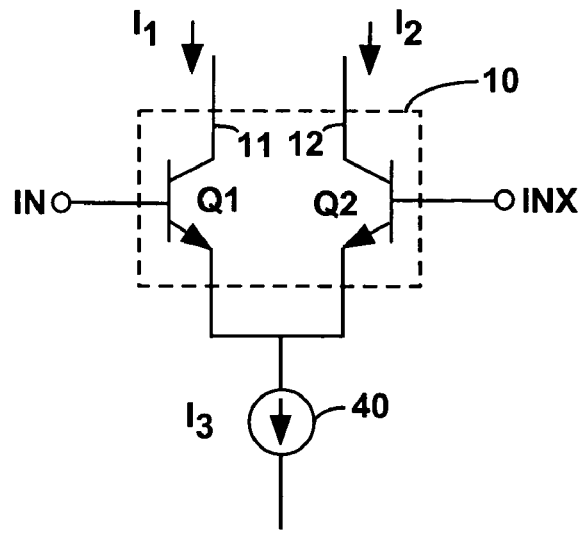
FIG. 1, already discussed in detail, is a circuit diagram showing a prior art DAC.
Figure 2:
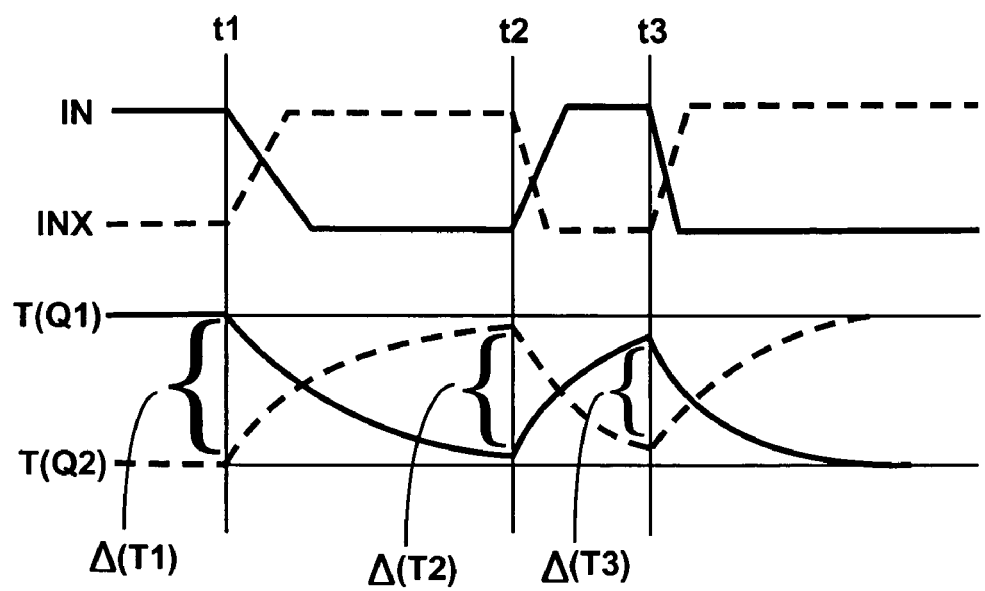
FIG. 2, already discussed in detail, is a wave form diagram showing the behavior of the circuit of FIG. 1.

Differently from the prior art configuration of FIG. 1, the DAC of FIG. 3 comprises a clocking circuit 20 and a bistable circuit 30. The clock circuit 20 comprises npn bipolar transistors Q3 and Q4. The bistable circuit 30 comprises npn bipolar transistors Q5 and Q6. The state of transistors Q3 and Q4 is controlled by a clock signal CK and its complementary signal CKX.

When the clock signal CK is high, the Q3 transistor is ON and the Q4 transistor is OFF. Therefore, the Q1-Q2 pair is connected with the current generator 40 and "listens" to the inputs IN and INX, while the Q5-Q6 bistable circuit pair is disconnected from the current generator 40. When the clock signal CK is low, the Q3 transistor is OFF and the Q4 transistor is ON. Therefore, the Q1-Q2 pair is not connected with the current generator 40, while the Q5-Q6 pair is connected with the current generator 40.

The timing of the clock signals CK, CKX is such that the input signals IN and INX are allowed to switch only when the Q1-Q2 pair is not connected with the current generator 40, i.e. only when the clock signal CK is low. In this way, the change in the value of the analog currents I1 and I2 as a result of the switching of transistors Q1 and Q2 will not be immediately sent to the collectors of transistors Q1 and Q2, but will be delayed up to when the clock signal CK goes high again. By way of this intentional delay, the early turning ON or OFF of the transistors Q1 or Q2 due to the switching of the input signals IN, INX will have no effect, because the input signals IN and INX will not be switching when the Q1-Q2 pair is connected with the current generator 40. During switching of the input signals IN and INX, the bistable circuit 30 will provide the current output I1, I2 with the value of the current output before switching of the input signals IN, INX by way of the connections 31, 32 between the collectors of transistors Q5, Q6 and the collectors of transistors Q1, Q2. Additionally, during switching of the input signals IN and INX, the transistors Q1 and Q2 will not switch from ON to OFF or from OFF to ON, because Q1 and Q2 will always be in an OFF condition due to the absence of connection with the current generator 40 in view of the OFF status of the clock transistor Q3. As soon as the clock CK goes high, the current outputs I1, I2 will return an analog value reflecting the new value of the signals IN, INX.

Figure 4:
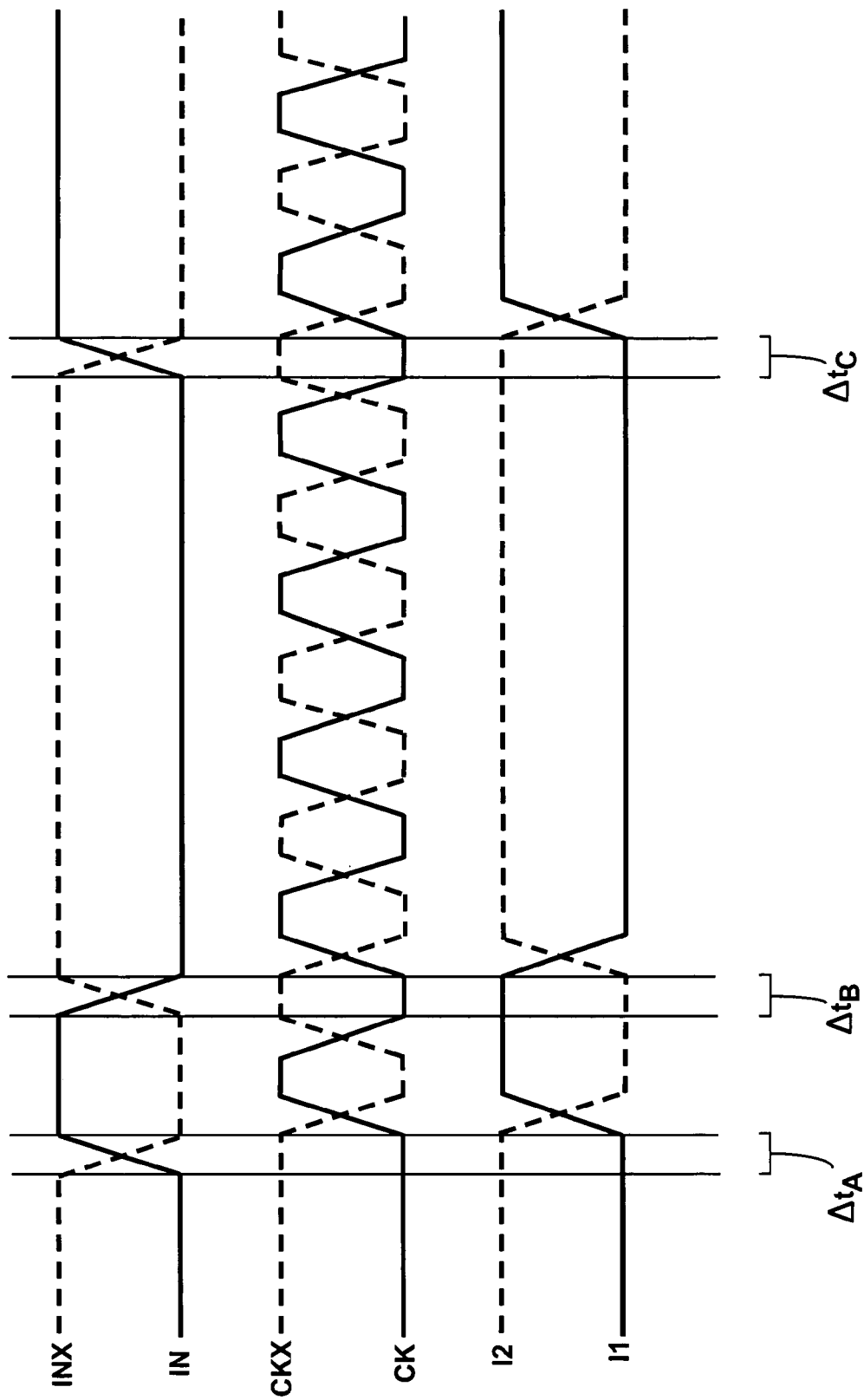
FIG. 4 is a wave form diagram showing the behavior of the circuit of FIG. 3.

FIG. 4 is a time chart showing the behavior of the circuit of FIG. 3 in a greater detail. In particular, three different graphs are shown, i.e. the voltage value of the inputs IN and INX as a function of time, the current value of the outputs I1 and I2 as a function of time, and the voltage value of the clock signals CK, CKX as a function of time.

The clock signals CK and CKX have a periodic behavior. The DAC according to the present invention is operated so that switching of the IN, INX signals occurs only when the differential pair 10 is not connected with the current generator 40. With reference to FIG. 4, the input signals IN, INX switch, for example, during time intervals $\Delta t_A$, $\Delta t_B$, and $\Delta t_C$. During those intervals the clock signal CK is always low. In other words, during switching of the inputs of the transistors Q1, Q2, the analog outputs I1, I2 of the DAC are fed by the bistable circuit 30. Therefore, the currents I1, I2 switch at a later stage, i.e. when the clock signal CK switches from low to high again, i.e. when the bistable circuit 30 is disconnected from the current generator 40 and the current generator 40 is connected with the Q1-Q2 differential pair again.

In this way, the time of switching of the outputs I1, I2 is not dependent on the temperature of the transistors Q1-Q2, because the temperature of the transistors will have fully settled by the time the clock signal CK goes high again. In other words, the ON/OFF status of the transistors Q1 and Q2 is asserted at the output only after switching of the inputs IN, INX and not during the switching of the inputs IN, INX. In other words, a clock transition, rather than the input signal transition, determines the output transition time.

Transistors Q3 and Q4 may also incur some form of thermal hysteresis. However, since switching of the clock is periodic and not aperiodic like the switching of signals IN, INX, the thermal hysteresis in Q3 and Q4 will not affect the precision of the DAC.

Figure 5:
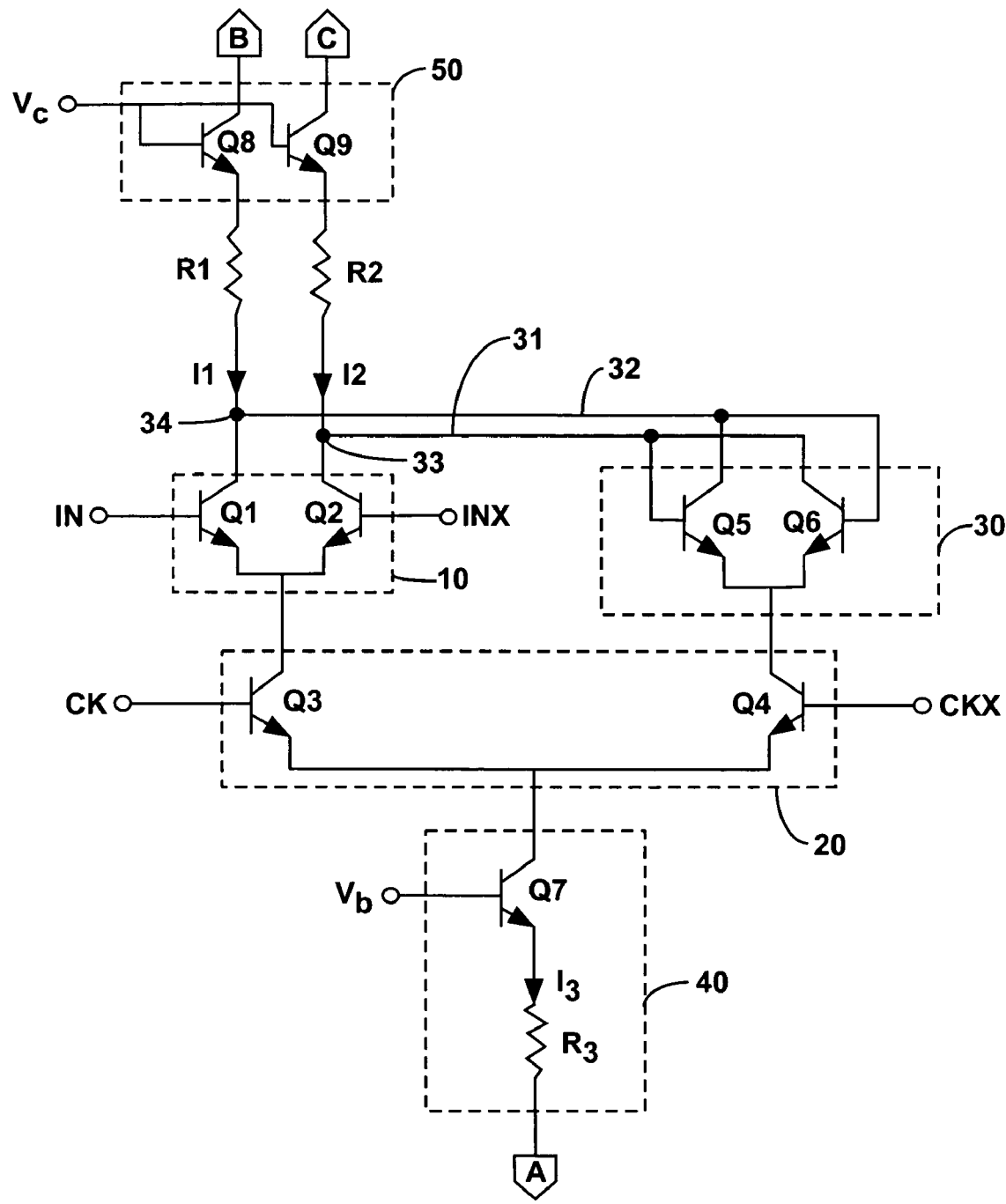
FIG. 5 is a further embodiment of a DAC according to the present disclosure.

FIG. 5 shows a further embodiment, where the circuit of FIG. 3 is provided with a cascode stage 50 comprising transistors Q8, Q9 coupled with resistors R1, R2. The cascode stage 50 is useful if the output nodes B, C are high-impedance nodes. In particular, the cascode stage 50 keeps the bistable circuit 30 from being dependent on the voltages at the output nodes B, C. Additionally, the cascode stage 50 provides a high output resistance, should this be necessary. If the output nodes B and C are low-impedance nodes, the cascode stage 50 is not necessary.

It should be noted that in both of the embodiments of FIG. 3 and FIG. 5 only a single current generator (i.e. the current generator 40 of FIGS. 3 and 5) is required, and that the current generator provides current to the differential pair 10 during a first portion of the period of the clock signal CK and to the bistable circuit 30 during the second portion of the period of the clock signal CK, thus minimizing power dissipation, because the same current generator is used for the first and the second portion of the period of the signal.

While several illustrative embodiments of the invention have been shown and described, numerous variations and alternative embodiments will occur to those skilled in the art. Such variations and alternative embodiments are contemplated, and can be made without departing from the scope of the invention as defined in the appended claims.

For example, although the disclosed embodiments make reference to npn transistors, those skilled in the art will realize that embodiments can be provided using pnp transistors, FET transistors, nMOS transistors, pMOS transistors, CMOS transistors, superconductors, MEMS switches, or a combination thereof.

Additionally, the person skilled in the art will note that the present disclosure more generally deals with a non-return-to-zero (NRZ) digital-to-analog converter comprising a single current source and having a first input, a second input and an output, wherein the first input determines how current is routed between the current source and the output, and the second input, for example a clock, determines when routing of the current between the current source and the output is allowed to change.

What is claimed is:

1. A digital-to-analog converter comprising:
    a differential transistor pair comprising a first input/output transistor and a second input/output transistor, the first input/output transistor and the second input/output transistor having an input terminal, an output terminal and a third terminal, the differential transistor pair receiving a differential logic signal at the input terminals of the first input/output transistor and the second input/output transistor;
    a bistable circuit connected with the output terminal of the first input/output transistor and the output terminal of the second input/output transistor;
    a clock circuit comprising a first clock transistor and a second clock transistor connected as a differential pair, the first clock transistor and the second clock transistor having a clock input terminal, a clock second terminal, and a clock third terminal, the clock second terminal of the first clock transistor being connected with the third terminal of the first and second input/output transistor, and the clock second terminal of the second clock transistor being connected with the bistable circuit; and
    a current source connected with the clock third terminal of the first clock transistor and the clock third terminal of the second clock transistor, wherein:
    the clock circuit acts as a switch, controlling the converter so as to provide current from the current source either to the differential transistor pair or to the bistable circuit; and
    the input terminals of the first and second input/output transistor receive signals switching between a first logic value and a second logic value, switching between the first logic value and the second logic value occurring when the clock circuit controls the converter so as to provide current from the current source to the bistable circuit, said switching being asserted at the output terminal of the first and second input/output transistor when the clock circuit controls the converter so as to provide current from the current source to the differential transistor pair.

2. The converter of claim 1, further comprising a first resistor connected with the output terminal of the first input/output transistor and a second resistor connected with the output terminal of the second input/output transistor.

3. The converter of claim 2, further comprising a cascode circuit connected with the first and second resistor.

4. The converter of claim 1, wherein the bistable circuit comprises a first bistable circuit transistor and a second bistable circuit transistor connected as a differential pair, the first and second bistable circuit transistor comprising a bistable circuit first terminal, a bistable circuit second terminal, and a bistable circuit third terminal.

5. The converter of claim 4, wherein the bistable circuit first terminal of the first bistable circuit transistor and the bistable circuit second terminal of the second bistable circuit transistor are connected with the output terminal of the second input/output transistor and the bistable circuit first terminal of the second bistable circuit transistor and the bistable circuit second terminal of the first bistable circuit transistor are connected with the output terminal of the first input/output transistor, and the bistable circuit third terminal of the first and second bistable circuit transistor are connected with the second clock transistor.

6. The converter of claim 1, wherein the first logic value and the second logic value of the signals received by the input terminals of the first and second input/output transistor are voltage values and output values of the output terminals of the first and second input/output transistor are current values.

7. The converter of claim 1, wherein the first input/output transistor, second input/output transistor, first clock transistor, and second clock transistor are selected from the group comprising npn transistors, pnp transistors, FET transistors, nMOS transistors, pMOS transistors, CMOS transistors, and MEMS switches.

8. A digital-to-analog conversion method comprising:
connecting a first transistor and a second transistor as a differential pair, the first transistor and the second transistor having a switch input terminal, a switch output terminal and a switch third terminal, the first transistor and second transistor receiving a differential logic signal at the switch input terminals;
connecting a bistable circuit with the switch output terminal of the first transistor and the output terminal of the second transistor;
connecting a third transistor and a fourth transistor as a differential pair, the third transistor and the fourth transistor having a dock input terminal, a clock second terminal, and a clock third terminal;
connecting the clock second terminal of the third transistor with the switch third terminal of the first and second transistor;
connecting the clock second terminal of the fourth transistor with the bistable circuit;
connecting the clock third terminal of the third transistor and fourth transistor with a current source;
providing the switch input terminal of the first transistor with a first input signal and the switch input terminal of the second transistor with a second input signal complementary to the first input signal, the first and second input signals being switchable between a first logic input value and a second logic input value;
providing the clock input terminal of the third transistor with a first clock signal and the clock input terminal of the fourth transistor with a second clock signal complementary to the first clock signal; and
switching the first clock signal between a first clock value and a second clock value, the first clock value allowing the third transistor to conduct current from the current source to the first and second transistor and allowing the fourth transistor to block current from the current source to the bistable circuit the second clock value allowing the third transistor to block current from the current source to the first and second transistor and allowing the fourth transistor to conduct current from the current source to the bistable circuit.

9. The method of claim 8, wherein the differential logic signal at the input terminals of the first and second transistor comprises an input signal switching between a first logic value and a second logic value.

10. The method of claim 9, wherein switching between the first logic value and the second logic value occurs during the second clock value of the first clock signal.

11. The method of claim 10, wherein said switching is asserted at the switch third terminal of the first and second transistor during the first clock value of the first clock signal.

12. A digital-to-analog converter comprising:
an input/output circuit receiving a digital input signal and outputting an analog output signal;
a bistable circuit connected with the input/output circuit;
a clock circuit connected with the input/output circuit and the bistable circuit; and
a current generator circuit connected with the clock circuit, wherein:
the clock circuit acts as a switch, providing current from the current generator either to the input/output circuit or to the bistable circuit;
the digital input signal is a switchable signal switching when the current generator provides current to the bistable circuit; and
the analog output signal is a switchable signal associated with the digital input signal, the analog output signal switching when the current generator provides current to the input/output circuit.

13. The converter of claim 12, further comprising a cascode circuit connected with the input/output circuit.

14. A non-return-to-zero digital-to-analog converter comprising a single current source and having a first input, a second input and an output wherein the first input determines how current is routed between the current source and the output and the second input determines when routing of the current between the current source and the output is allowed to change, wherein the first input is a digital voltage input and the output is an analog current output.

15. The digital-to-analog converter of claim 14, wherein the second input is a clock signal.

* * * * *